United States Patent [19]

Herdzik et al.

[11] 3,839,727

[45] Oct. 1, 1974

[54] IMPROVED SEMICONDUCTOR CHIP TO SUBSTRATE SOLDER BOND USING A LOCALLY DISPERSED, TERNARY INTERMETALLIC COMPOUND

[75] Inventors: Richard J. Herdzik, Poughkeepsie; Dexter A. Jeannotte, Clinton Corners; Gerald W. Peterson, Poughkeepsie; Michael J. Sullivan, Rhinebeck, all of N.Y.

[73] Assignee: International Business Machines Corporation, Armonk, N.Y.

[22] Filed: June 25, 1973

[21] Appl. No.: 373,524

[52] U.S. Cl. .......... 357/71, 357/70, 357/66, 29/578, 29/579

[51] Int. Cl. .......... H01l 3/00, H01l 5/00

[58] Field of Search .......... 317/234, 5, 5.2, 5.3, 5.4; 29/580, 579, 588, 589, 578

[56] References Cited

UNITED STATES PATENTS

| | | | |
|---|---|---|---|
| 3,331,996 | 7/1967 | Green | 317/234 M |
| 3,458,925 | 8/1969 | Napier et al. | 317/234 M |
| 3,508,118 | 4/1970 | Merrin et al. | 317/234 L |
| 3,585,713 | 6/1971 | Kaneda et al. | 317/234 M |

*Primary Examiner*—Andrew J. James
*Attorney, Agent, or Firm*—William J. Dick; Kenneth R. Stevens

[57] ABSTRACT

A solder bond between a semiconductor chip and a substrate is improved by the addition of a region of solder which is dispersion hardened with a ternary intermetallic. In the preferred embodiment the solder is constituted by a solid solution of tin in lead and a uniformly dispersed copper/tin/palladium ternary intermetallic. One of the constituents of the ternary intermetallic is a constituent of the solder.

9 Claims, 6 Drawing Figures

IMPROVED SEMICONDUCTOR CHIP TO SUBSTRATE SOLDER BOND USING A LOCALLY DISPERSED, TERNARY INTERMETALLIC COMPOUND

BRIEF DESCRIPTION OF THE PRIOR ART

As described in U.S. Pat. No. 3,429,040, issued Feb. 25, 1969, and assigned to the assignee of the present invention as well as the other U.S. patents cited therein, a preferred means of joining a semiconductor chip to a substrate is to employ a solder reflow interconnection which is constituted by a solder composition which is between about 5 to 40 percent by weight tin and 95 to 60 percent by weight lead.

This basic prior art metallurgical system for joining a semiconductor chip to a dielectric substrate is illustrated in FIGS. *1a* through *1c* inclusive. Semiconductor chip 10 is metallized prior to the solder reflow process. Bottom metal layer 14 typically comprises a thin chrome layer 1,000A thick, a copper plus chrome phased layer 16 of approximately 1,000A thickness, a copper layer 18 of approximately 10,000A thickness, a gold layer 20 approximately 1,400A thick, a lead region 22 approximately 2.85 mils in height and finally a tin layer 24 of approximately 0.15 mils in height. The lead and tin regions 22 and 24 are shown as separate metals at this point of the process, however, it is to be realized that an alloy of the two metals, as is well known in the art, is equally suitable.

The structure shown in FIG. *1a* is then reflowed to homogenize the structure and then inverted and positioned on a dielectric substrate 30, typically ceramic. The substrate 30 contains its own metallurgical interconnection pattern generally illustrated at 29. After the assembly is passed through a solder reflow furnace, a resulting metallurgical interconnection system as illustrated in FIGS. *1b* and *1c* is achieved. The metallurgical pattern on the dielectric substrate 30 is constituted by an underlying chrome layer 32, a conductive copper layer 34, and an overlying chrome layer 36. The primary bond between the semiconductor chip 10 and the substrate 30 is constituted by the lead/tin joint 40. It is noted that there are two significant interfaces, interface 42 between the lead/tin joint 40 and the semiconductor chip, and interface 44 between the lead/tin joint 40 and the metallurgical pattern 29 on the dielectric substrate 30. The interface 42 is essentially constituted by a thin chromium layer 50 which corresponds to the previous layer 14 illustrated in FIG. *1a* prior to the reflow heating step. Further, a binary intermetallic region or zone shown at 52 is dispersed within the solid solution of tin in lead designated at 40. The binary intermetallic 52 region essentially comprises a copper/tin binary intermetallic system. It is also noted that at the interface 44 there is also formed in the region 40 a very narrow copper/tin intermetallic zone just above the copper layer 34 (not specifically shown).

Now referring to FIG. *1c* it can be seen that the very soft maleable lead/tin region 40 is employed to interconnect interfaces 42 and 44 which comprise harder or higher melting point metallurgical systems. Consequently, most of the interconnection physical failures between the lead/tin solder region 40 and the interface 42 occur in the region illustrated by the dark broken line 60. It can be concluded that the maximum strain and stresses developed in the interconnection joint illustrated in FIG. *1c* is related to the nature, geometry, location and extent of the binary copper-tin intermetallic region 2. In a binary system it is theorized that the tin is depleted from the lead/tin solder region illustrated at 40 near the interface 42 to the semiconductor chip 10, thus removing solid solution hardening effects.

With the existing binary system it might be through that very long reflow times or reflow cycles could cause a thin binary tin copper intermetallic region 52 to expand or extend deeper into the region depicted as 40 and thus improve the strength at the interface 42 between the soft malleable metal system 40. However, this approach is ineffective as suitable dispersion hardening agents because the intermetallic particles become extremely large and lose their hardening characteristics. Also, the number of times and number of reflow cycles that would be necessary to extend the binary intermetallic layer 52 a significant depth into the lower melting point or softer solder region 40 is prohibitive in terms of its damaging effect upon the semiconductor devices and other attendant systems.

SUMMARY OF THE INVENTION

It is therefore an object of the present invention to provide a controlled intermetallic dispersion hardened region into a softer solder system used to join a semiconductor chip and substrate.

Another object of the present invention is to introduce a controlled ternary intermetallic region in a solder metal system so as to minimize non-uniform strain distribution and establish a more uniform extended strain distribution whose position is located a greater distance from the semiconductor chip surface, that is, to extend the intermetallic region more uniformly into the critical high stress cross-section further from the chip surface; instead of confining it to a region immediately adjacent the semiconductor chip surface.

Another object of the present invention is to improve the grain structure of a solder joint by dispersing an intermetallic into the liquid solder during reflow so as to generate heterogenous nucleation sites for the grain nucleation in order to improve physical properties such as yield strength, creep rate, etc.

Another object of the present invention is to improve the creep strength of a solder joint between a semiconductor chip and a substrate by providing an extended zone of dispersed intermetallics within the solid solution comprising the solder metals so as to require dislocations, during thermal cycling, to be raised from their existing planes in order to bypass the dispersed intermetallics.

Another object of the present invention is to provide a controlled ternary intermetallic zone, sometimes referred to in the prior art as "spalling," as a means of improving the strength of a solder joint between a semiconductor chip and a substrate whereas "spalling" is generally considered to be an undesirable effect.

The present invention provides means of joining a semiconductor chip to a dielectric substrate comprising a solder system interconnecting first and second metallurgical interfaces located adjacent to the semiconductor chip and adjacent to the dielectric substrate, respectively. The solder joint further includes a ternary intermetallic zone uniformly distributed in the solid solution comprising the solder metals for improving the strength or fatigue life of the solder joint between the first and second metallurgical interfaces, each of which possess a higher melting temperature than that of the solder metal or metals per se.

DESCRIPTION OF THE PREFERRED EMBODIMENTS

Figure 1A:
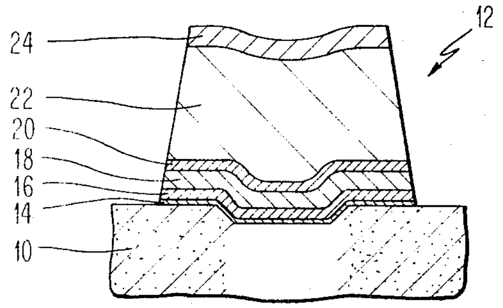
FIGS. 1*a* through 1*c* are partial cross-sections illustrating a prior art solder interconnection joint between a semiconductor chip and a dielectric substrate.
Figure 2A:
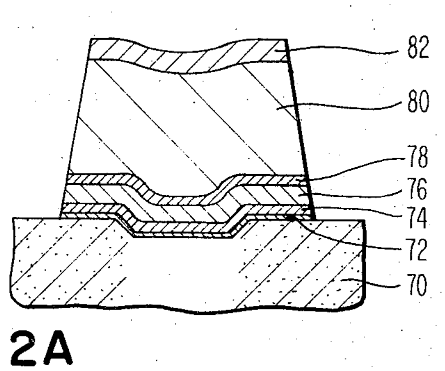
FIGS. 2*a* through 2*c* are partial cross-sections illustrating the improved solder interconnection of the present invention for joining a semiconductor chip to a dielectric substrate.
Figure 2B:
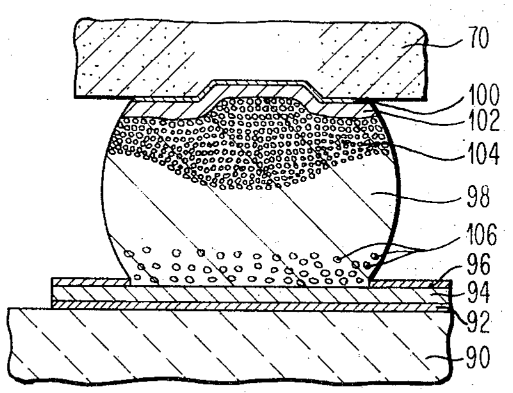
Figure 2C:
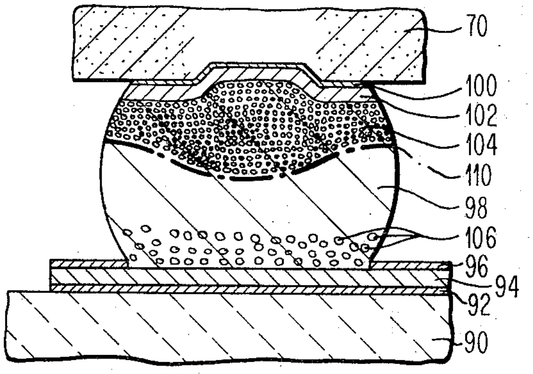

Now referring to FIGS. 2*a* through 2*c*, in FIG. 2*a*, a semiconductor chip 70 comprising integrated circuits (not shown) is prepared at designated bonding areas by the deposition of a metallurgical system comprising a lower-most chromium layer 72, a copper chrome phased layer 74, a copper layer 76, and a palladium layer 78. The structure is completed by a lead region 80 and a tin layer 82. The palladium layer 78 in the preferred embodiment is approximately 2,000A thick. It can be seen that the structure in FIG. 2*a* is substantially identical as to starting materials and thicknesses with the prior art previously depicted in FIG. 1*a* with one important difference. The gold layer 20 of the prior art is now replaced with a palladium layer 78.

Figure 1B:
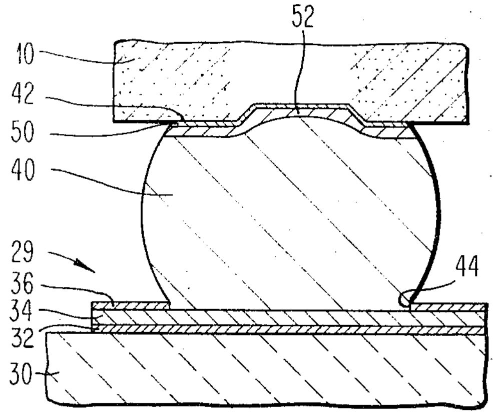

FIG. 2*b* illustrates the structure of FIG. 1 wherein it is reflowed to homogenize the structure and then inverted and joined to a ceramic dielectric substrate 90 which further includes an underlying chrome layer 92, a conductive copper layer 94, and an overlying chrome layer 96. As a result of the solder reflow cycle at approximtely 350°C. and subsequent cooling, the metallurgical structure as schematically represented in FIGS. 2*b* and 2*c* is attained. At the interface between the semiconductor chip 70 and the lead/tin solder joint 98 there exists a thin chrome layer 100, a binary intermetallic layer of copper and tin 102, and finally an extended zone or ternary intermetallic region 104. Also, a limited intermetallic system is created at the interface between the solder joint 98 and the ceramic substrate 90 and comprises a copper/tin/palladium intermetallic zone 106. Accordingly, the substitution of palladium in place of the gold layer generates a ternary intermetallic system at both of the interfaces between the semiconductor chip and the ceramic substrate 90. For purposes of illustration the intermetallic zones depicted in the drawings are shown as separate identities, but it is realized that from a truly technical standpoint the intermetallic zones are formed in the solid solution of tin in lead, i.e., solder system per se.

Figure 1C:
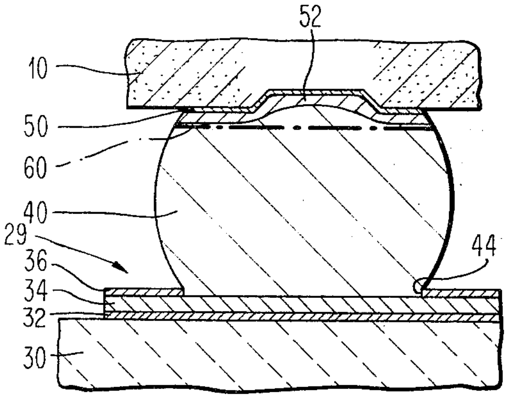

As depicted in FIG. 2*c*, the existence of the extended ternary intermetallic zone 104 significantly extends into the lead/tin solder region 98 and as a result provides a much more uniform stress distribution while simultaneously lowering the fracture line of the joint to that depicted by the broken heavy line 110 much lower than the fracture line 60 of the prior art, FIG. 1*c*. Thus the addition of a ternary generating metal such as palladium increases the fatigue life of the solder joint between the semiconductor chip 70 and the ceramic substrate 90 so as to minimize failures or cracks due to repeated thermal cycling.

Although the exact metallurgical mechanism is not fully understood it is felt that the addition of palladium to the copper/tin system results in the formation of a ternary intermetallic (approximately a 1:1 mix of $PdSn_4$ and $Cu_3Sn$) and also a ternary eutectic (0.5 percent copper, 0.1 percent Pd and 99.4 percent Sn) with a melting point of 217°C. Thus during solder reflow at approximately 350°C both the ternary metallic and the eutectic will form in the copper-palladium-tin diffusion zone. The formation of this ternary intermetallic possibly causes the local concentration near the intermetallic to approach that of the eutectic. This possible action would cause the liquid eutectic formation to surround the intermetallic and allow it to spall off into the liquid solder comprising the lead/tin system in the preferred embodiment. Longer reflow times or multiple reflows will further cause the intermetallic to form and also further move the intermetallic from the interface due to random fluctuations, of the movement can be also enhanced by means of externally applied forces such as gravity, centrifugal force, etc.

Another theory to explain the spalling or formation of the ternary intermetallic is the introduction into the binary system of a third component, palladium in the preferred embodiment, which possesses a different lattice parameter. This would result in a highly strained intermetallic structure which would fracture and spall into the liquid solder during reflow.

In any event, the formation of the control ternary intermetallic zone in the solder joint, improves the fatigue life of the solder joint. In the present invention intermetallic is defined as an intermediate phase in an alloy system which has a narrow range of homogeneity and relatively simple stoichiometric proportions in which the nature of the atomic binding is metallic.

In the preferred embodiment the ternary intermetallic consists of tin/copper/palladium. However, it is felt that other ternary systems in a solder ball environment would similarly form an extended dispersion hardened zone in the solder joint so as to improve fatigue life of the joint. Other suggested solder materials are for example indium tin or indium lead. A substitute for the copper material in the preferred embodiment would be such metals as nickel, gold, silver, etc. Finally, suitable equivalents for the palladium metal of the preferred embodiment might consist of platinum, ruthenium, rhodium, and iridium. Although the present invention describes a preferred embodiment consisting of a tin/copper/palladium intermetallic, it is metallurgically expected that one in the art is capable of generating other controlled dispersion hardened intermetallics by routine experimentation in order to improve the fatigue life of a solder bond between a semiconductor chip and a dielectric substrate.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface wherein the improvement comprises:

a. a first, at least ternary, intermetallic region located at said first interface and uniformly dispersed in a predetermined portion of said solid solder solution material.

2. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface as in claim 1 wherein:

a. said ternary intermetallic region comprises tin/copper/palladium.

3. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface wherein the improvement comprises:

a. a first ternary intermetallic region located at said first interface and a predetermined uniformly dispersed in portion of said solid solder solution material.

b. said first ternary metallic region including a first metal constituent, said first metal constituent also being a constituent of said first metal means; a second metal constituent, said second metal constituent also being a constituent of said solid solder solution material; and a third metal constituent forming a ternary intermetallic with said first and second metal constituents.

4. A packaging structure for interconnecting semiconductor substrates carrying integrated circuits to a dielectric substrate having electrical interconnection paths therein by means of said solid solder solution material, the solid solder solution material electrically and mechanically connecting a first metal means carried by the semiconductor substrate at a first interface to second metal means carried by the dielectric substrate at a second interface as in claim 3 wherein:

a. said first metal constituent comprises copper, said second metal constituent comprises tin, and said third metal constituent comprises palladium.

5. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface as in claim 4 wherein:

a. said first metal means comprises copper lands located on said semiconductor substrate.

6. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface as in claim 5 further including:

a. a second ternary intermetallic region located at said second interface and uniformly dispersed in said solder solution material, b. said second ternary intermetallic region including a fourth metal constituent, said fourth metal constituent also being a constituent of said second metal means carried by said dielectric substrate;

c. a fifth metal constituent, said fifth metal constituent also being a constituent of said solder solution material; and d. a sixth metal constituent capable of forming a ternary intermetallic with said third and fourth metal constituents.

7. A packaging structure for interconnecting semiconductor substrates carrying integrated circuits to a dielectric substrate having electrical interconnection paths therein by means of a solid solder solution material, the solid solder solution material electrically and mechanically connecting a first metal means carried by the semiconductor substrate at a first interface to second metal means carried by the dielectric substrate at a second interface as in claim 6 wherein:

a. said first and fourth metal constituents are identical, said second and fifth metal constituents are identical, and said third and sixth metal constituents are identical.

8. A method of bonding an integrated circuit semiconductor substrate to a dielectric substrate having conductive paths comprising the steps of:

a. depositing a solder system onto metal conductive means located on said semiconductor substrate, b. selecting first and second metals for said solder system capable of forming a ternary intermetallic with a third metal of said metal conductive means, c. positioning said semiconductor substrate on said dielectric substrate for forming an integrated circuit package, and d. heating and cooling said integrated circuit package for forming a solid solution solder bond of said solder system and having a ternary intermetallic region uniformly dispersed in a predetermined portion thereof, said ternary intermetallic region extending away from an interface constituted by said metal conductive means located on said semiconductor substrate and said solid solution solder bond.

9. A method of bonding an integrated circuit semiconductor substrate to a dielectric substrate having conductive paths as in claim 8 comprising the steps of:

a. selecting copper as said metal conductive means, and b. selecting tin and palladium as said first and second metals, respectively.

* * * * *